US012143169B2

(12) United States Patent
Garcia et al.

(10) Patent No.: US 12,143,169 B2
(45) Date of Patent: *Nov. 12, 2024

(54) CONTROLLER FOR A SEMICONDUCTOR SWITCH THAT INCLUDES AN INDUCTIVE COUPLING FOR COMMUNICATION ACROSS GALVANIC ISOLATION

(71) Applicant: Power Integrations, Inc., San Jose, CA (US)

(72) Inventors: Olivier Garcia, Brügg (CH); Jan Thalheim, Biel (CH); Didier Raphael Balli, Biel-Bienne (CH); Matthias Peter, Orpund (CH)

(73) Assignee: POWER INTEGRATIONS, INC., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/201,663

(22) Filed: May 24, 2023

(65) Prior Publication Data
US 2023/0370119 A1 Nov. 16, 2023

Related U.S. Application Data

(63) Continuation of application No. 17/545,830, filed on Dec. 8, 2021, now Pat. No. 11,700,037, which is a
(Continued)

(30) Foreign Application Priority Data

Dec. 5, 2017 (EP) .................................... 17205539

(51) Int. Cl.
*H04B 5/00* (2024.01)
*H02J 50/10* (2016.01)
(Continued)

(52) U.S. Cl.
CPC ................ *H04B 5/24* (2024.01); *H02J 50/10* (2016.02); *H02J 50/80* (2016.02);
(Continued)

(58) Field of Classification Search
CPC .. H02J 50/12; H02J 7/025; H02J 50/80; H02J 5/005; H02J 50/10; H02J 50/40;
(Continued)

(56) References Cited

U.S. PATENT DOCUMENTS 5,963,438 A 10/1999 Chen
8,077,484 B2 12/2011 Djenguerian et al.
(Continued)

FOREIGN PATENT DOCUMENTS

CN 102752918 A 10/2012
CN 103580486 A 2/2014
(Continued)

OTHER PUBLICATIONS

Japanese Notice of Allowance; Application No. 2018-211023; mailed Dec. 13, 2022; 4 pages.
(Continued)

*Primary Examiner* — Golam Sorowar
(74) *Attorney, Agent, or Firm* — Karina Martha G. Li

(57) ABSTRACT

A controller comprising a driver interface referenced to a first reference potential, a drive circuit referenced to a second reference potential, and an inductive coupling. The driver interface comprises a first receiver configured to compare a portion of signals having a first polarity on the first terminal of the inductive coupling with a first threshold, and a second receiver configured to compare a portion of signals having a second polarity on the second terminal of the inductive coupling with a third threshold. The drive circuit comprises a first transmitter configured to drive current in a first direction in the second winding to transmit
(Continued)

first signals, and a second transmitter configured to drive current in a second direction in the second winding to transmit second signals, the second direction opposite the first direction.

21 Claims, 10 Drawing Sheets

Related U.S. Application Data continuation of application No. 16/748,776, filed on Jan. 21, 2020, now Pat. No. 11,223,391, which is a continuation of application No. 16/206,667, filed on Nov. 30, 2018, now Pat. No. 10,574,302.

(51) Int. Cl.
| | | |
|---|---|---|
| H02J 50/80 | (2016.01) | |
| H03K 17/042 | (2006.01) | |
| H03K 17/082 | (2006.01) | |
| H04B 5/24 | (2024.01) | |
| H04B 5/26 | (2024.01) | |
| H04B 5/72 | (2024.01) | |
| H04B 5/75 | (2024.01) | |
| H04B 5/79 | (2024.01) | |
| H04L 25/02 | (2006.01) | |

(52) U.S. Cl.
CPC ... H03K 17/04213 (2013.01); H03K 17/0826 (2013.01); H04B 5/266 (2024.01); H04B 5/72 (2024.01); H04B 5/75 (2024.01); H04B 5/79 (2024.01); H04L 25/0266 (2013.01)

(58) Field of Classification Search
CPC ........ H02J 50/60; H02J 7/00034; H02J 50/90; H02J 50/20; H02J 50/70; H02J 7/045; H02J 7/00; H02J 7/0042; H02J 7/00036; H02J 7/00047; H02J 7/0029; H02J 7/00712; H02J 7/00714; H02J 2207/20; H04B 5/0037; H04B 5/0031; H04B 5/0075; H04B 5/0081; H04B 5/0068; H04B 1/48; H04B 1/525; H04B 2203/5475; H04B 5/005; H04B 5/0093; H04B 2203/5412; H04B 2203/5416; H04B 2203/542; H04B 2203/5425; H04B 2203/5466; H04B 2203/5483; H04B 2203/5491; H04B 3/54; H04B 3/542; H02M 3/33523; H02M 1/32; H02M 3/33592; H02M 1/08; H02M 3/33507; H02M 2001/0009; H02M 1/36; H02M 2001/0058; H02M 3/33576; H02M 3/337; H02M 1/12; H02M 2001/0006; H02M 3/33515; H02M 3/33546; H02M 3/3376; H02M 7/53871; H02M 2001/0012; H02M 2001/0025; H02M 3/33538; H02M 3/33569
See application file for complete search history.

(56) References Cited

U.S. PATENT DOCUMENTS

| | | |
|---|---|---|
| 8,897,039 B2 | 11/2014 | Zhu et al. |
| 9,071,152 B2 | 6/2015 | Morong et al. |
| 9,136,765 B2 | 9/2015 | Balakrishnan et al. |
| 9,166,486 B2 | 10/2015 | Matthews et al. |
| 9,312,777 B2 | 4/2016 | Lefedjiev et al. |
| 9,374,011 B2 | 6/2016 | Liu et al. |
| 9,502,985 B2 | 11/2016 | Werner et al. |
| 9,742,288 B2 | 8/2017 | Balakrishnan et al. |
| 9,762,129 B2 | 9/2017 | Balakrishnan et al. |
| 9,948,294 B2 | 4/2018 | Peter et al. |
| 10,056,943 B2 | 8/2018 | Dzung et al. |
| 11,831,246 B1 * | 11/2023 | Vinciarelli ........ H02M 3/33592 |
| 2012/0193993 A1 | 8/2012 | Azancot et al. |
| 2013/0260676 A1 | 10/2013 | Singh |
| 2015/0168484 A1 * | 6/2015 | Ratz .................. G01R 31/2608 |
| | | 324/762.08 |
| 2015/0171934 A1 | 6/2015 | Brauchler et al. |
| 2015/0229149 A1 | 8/2015 | Fahlenkamp et al. |
| 2015/0248966 A1 | 9/2015 | Morokuma et al. |
| 2015/0326008 A1 | 11/2015 | Bäurle et al. |
| 2016/0268909 A1 | 9/2016 | Liu et al. |
| 2016/0277071 A1 | 9/2016 | Dzung et al. |
| 2016/0329751 A1 | 11/2016 | Mach et al. |
| 2017/0012622 A1 | 1/2017 | Peter et al. |
| 2017/0012672 A1 | 1/2017 | Peter et al. |
| 2017/0033603 A1 | 2/2017 | Peter et al. |
| 2017/0187367 A1 | 6/2017 | Rätz |
| 2017/0244328 A1 | 8/2017 | Leong et al. |
| 2017/0288557 A1 | 10/2017 | Fang et al. |
| 2017/0294783 A1 * | 10/2017 | Gluzman ................ H04B 5/24 |
| 2018/0076715 A1 * | 3/2018 | Moffat ................ H02M 1/08 |
| 2018/0159434 A1 | 6/2018 | Werner et al. |
| 2018/0269797 A1 * | 9/2018 | Vemuri ............ H02M 3/33523 |
| 2018/0351463 A1 | 12/2018 | Werner et al. |
| 2018/0358902 A1 | 12/2018 | Duvnjak |
| 2019/0089183 A9 | 3/2019 | Alves et al. |
| 2019/0089412 A1 * | 3/2019 | Fornage ............... H05K 1/0239 |
| 2019/0222131 A1 * | 7/2019 | King ................ H02M 3/33592 |
| 2019/0280599 A1 | 9/2019 | Moffat et al. |
| 2021/0376735 A1 * | 12/2021 | Parisi ................ H02M 3/33592 |

FOREIGN PATENT DOCUMENTS

| | | |
|---|---|---|
| CN | 106341034 A | 1/2017 |
| CN | 106571835 A | 4/2017 |
| EP | 3014771 A1 | 5/2016 |
| EP | 3116179 A1 | 1/2017 |
| JP | 2009232637 A | 10/2009 |
| JP | 2014011708 A | 1/2014 |
| JP | 2017041706 A | 2/2017 |
| JP | 2017525166 A | 8/2017 |
| JP | 2017188903 A | 10/2017 |
| WO | 2015044214 A2 | 4/2015 |

OTHER PUBLICATIONS

Chinese Application No. 201811472189.9; First Office Action; Mar. 29, 2021; 3 pages.
Chinese Application No. 2018114721899; Search Report with Translation; Mar. 29, 2021; 3 pages.
Chinese Application No. 2018114721899; Notice of Allowance mailed Jan. 10, 2022; 1 page.
European Application No. 17205539.4 Extended European Search Report; Jun. 15, 2018; 8 pages.
European Application No. 20201546.7 Extended European Search Report; May 3, 2021; 9 pages.
European Application No. 20201546.7, Decision to grant a European patent pursuant to Article 97(1) EPC, mailed Jul. 20, 2023; 2 pages.
European Application Serial No. 23190834.4, Extended European Search Report mailed Oct. 23, 2023, 6 pages.
Chinese Application Serial No. 202210302993.2; Notice of Grant and Search Report with Machine Translation; mailed Aug. 16, 2024; 3 pages.
Chinese Application Serial No. 202210302993.2; First Office Action with Machine Translation; mailed Jun. 26, 2024; 7 pages.

* cited by examiner

201

| ACTION | | EXAMPLE |
|---|---|---|
| COMMAND TX | "ON": $V_P = +V_{DD}$ for $T_1$<br>"OFF": $V_P = -V_{DD}$ for $T_1$ | $V_{DD} = +15V$; $T_1 = 200ns$ |
| FAULT TX | "FAULT": $I_{FAULT} = I_2$ for $T_2$<br>"NO FAULT": $I_{FAULT} = 0$<br>$T_2 >> T_1$ | $I_2 = 170mA$; for $T_2 = 4.4\mu s$ |
| DATA TX | "1": $I_{DATA} = I_3$ for $T_3$<br>"0": $I_{DATA} = 0$<br>$T_3 >> T_1$ | $I_3 = 30mA$; for $T_3 = 14\mu s$ |

| PRIORITY | | EXAMPLE |
|---|---|---|
| (HIGHEST) FAULT TX | LARGE CURRENT FOR A LONG DURATION OF TIME | $I_2$ = 170mA; for $T_2$ = 4.4μs<br>TH1 = 100-145mA |
| COMMAND TX | LARGE VOLTAGE FOR A SHORT DURATION OF TIME | $V_{DD}$ = +15V ($I_{CMD}$=70mA);<br>$T_1$ = 200ns |
| DATA TX | SMALL CURRENT FOR A LONG DURATION OF TIME | $I_3$ = 30mA; for $T_3$ = 14μs<br>TH3 = 10-20mA |
| (LOWEST) DEMAG TX | SMALL CURRENT FOR A LONG DURATION OF TIME, OPPOSITE POLARITY OF DATA TX | $I_3$ = 30mA; for $T_3$ = 14μs |

FIG. 6A

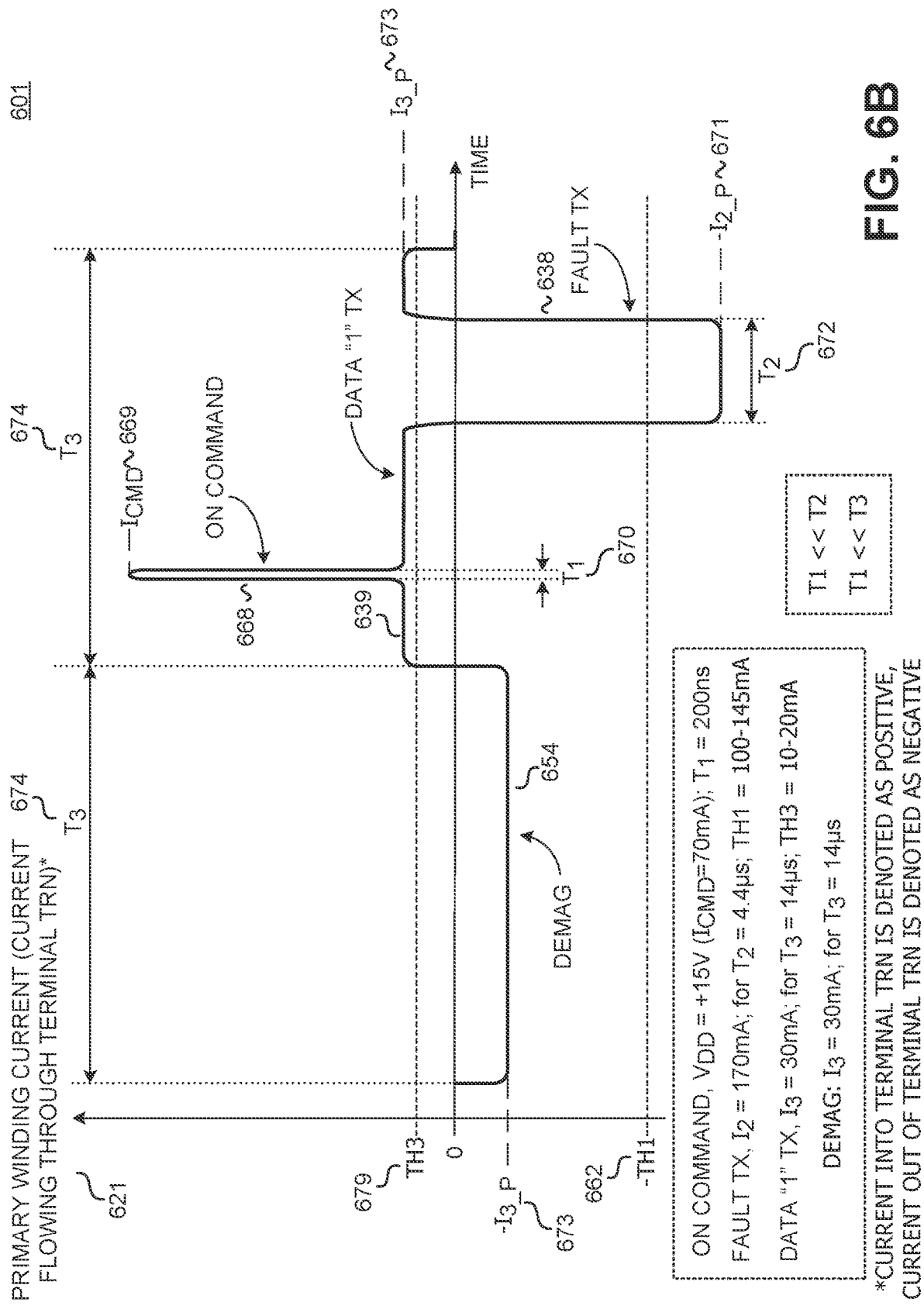

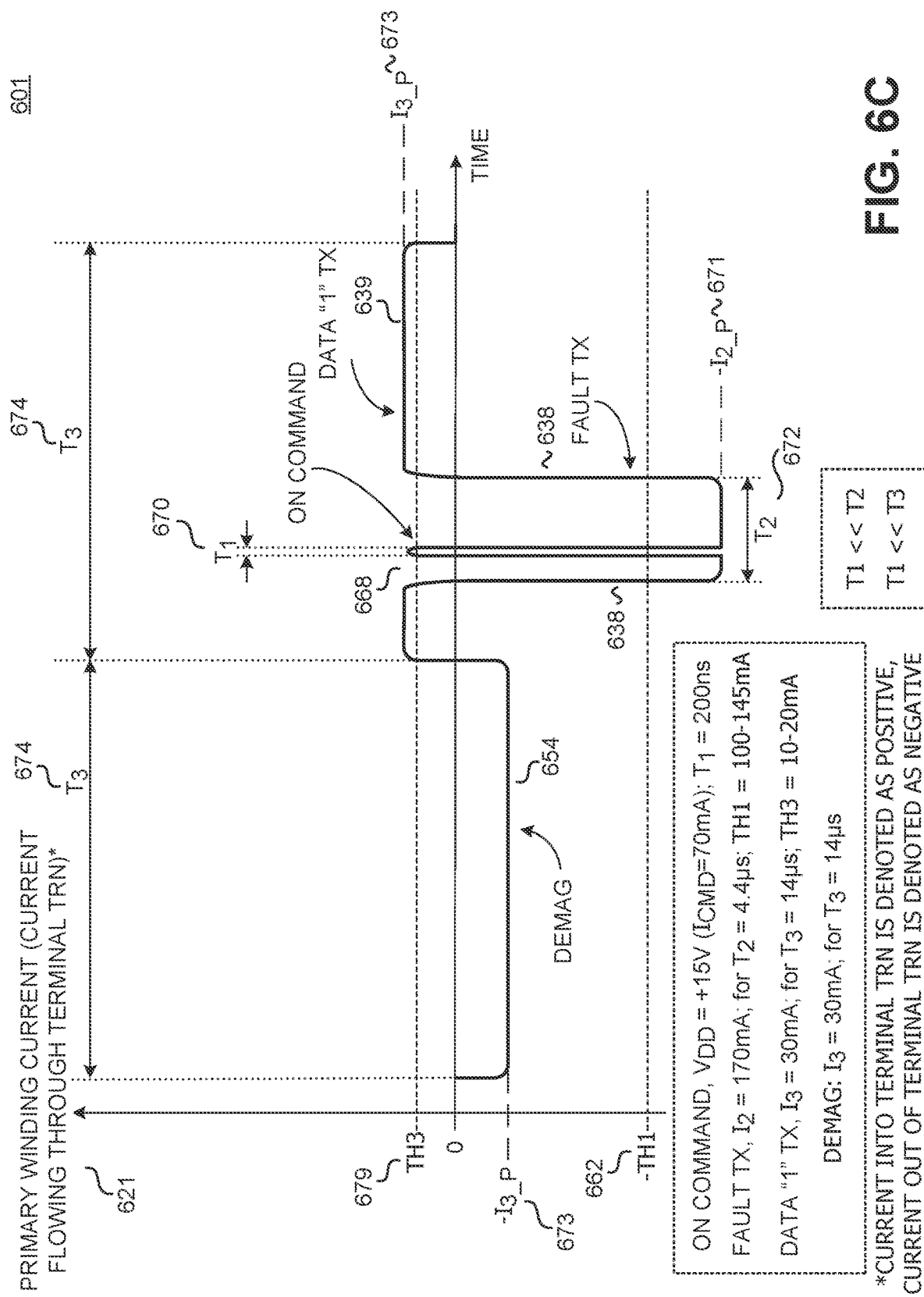

CONTROLLER FOR A SEMICONDUCTOR SWITCH THAT INCLUDES AN INDUCTIVE COUPLING FOR COMMUNICATION ACROSS GALVANIC ISOLATION

REFERENCE TO RELATED APPLICATIONS

This application is a continuation of U.S. patent application Ser. No. 17/545,830 filed on Dec. 8, 2021, now pending, which is a continuation of U.S. patent application Ser. No. 16/748,776, filed Jan. 21, 2020, which has now been granted with U.S. Pat. No. 11,223,391, which is a continuation of U.S. patent application Ser. No. 16/206,667 filed on Nov. 30, 2018 which has now been granted with patent no. U.S. Pat. No. 10,574,302 which claims priority to European Patent (EP) Application No. 17205539.4, filed Dec. 5, 2017. U.S. patent application Ser. No. 16/206,667 and EP Application No. 17205539.4 are hereby incorporated by reference in their entirety.

BACKGROUND OF THE INVENTION

Field of the Invention

The present invention relates generally to communications using an inductive coupling. For example, a controller for a semiconductor switch can include a transmitter and receiver that communicate across galvanic isolation using an inductive coupling.

Discussion of the Related Art

Electrical devices in many contexts include a communication system to send information between a transmitter and a receiver that are galvanically isolated and are hence referenced to different ground potentials. Examples include power converters, medical equipment, marine equipment, and the like. The communications channel in such communication system can be implemented using an inductive coupling like a signal transformer. Like other transformers, signal transformers can transfer electrical energy across galvanic isolation. In general, signal transformers are designed to minimize leakage inductance and stray capacitance and thereby improve high-frequency response. For example, the windings of a signal transformer can be split into sections and interleaved.

Switching power converters generally convert an input into a regulated output for a load by controlling the transfer of power across an energy transfer element. In operation, one or more switches are controlled to provide the desired power transfer. A wide variety of approaches have been described, including varying the duty cycle (i.e., the ratio of the on-time of the switch to the total switching period), varying the switching frequency, and/or varying the number of current conduction pulses per unit time.

A power converter can have a primary side and a secondary side that are galvanically isolated from each other. A power converter can also include one or more controllers to control the one or more switches. The one or more controllers may communicate across the galvanic isolation. One such communication system uses the windings of an inductive coupling to send information from a transmitter to a receiver.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

FIG. 2B is a table illustrating example current values for various signals of the controller shown in FIG. 2A in accordance with an embodiment of the present disclosure.

FIG. 6A is a table illustrating priorities between the various transmissions between the driver interface and drive circuit of FIG. 2A in accordance with an embodiment of the present disclosure.

FIG. 6B is a timing diagram illustrating the primary winding current when there is a collision between a data transmission, command transmission, and a fault transmission in accordance with an embodiment of the present disclosure.

FIG. 6C is a timing diagram illustrating another example of the primary winding current for when there is a collision between a data transmission, command transmission, and a fault transmission in accordance with an embodiment of the present disclosure.

Figure 1:
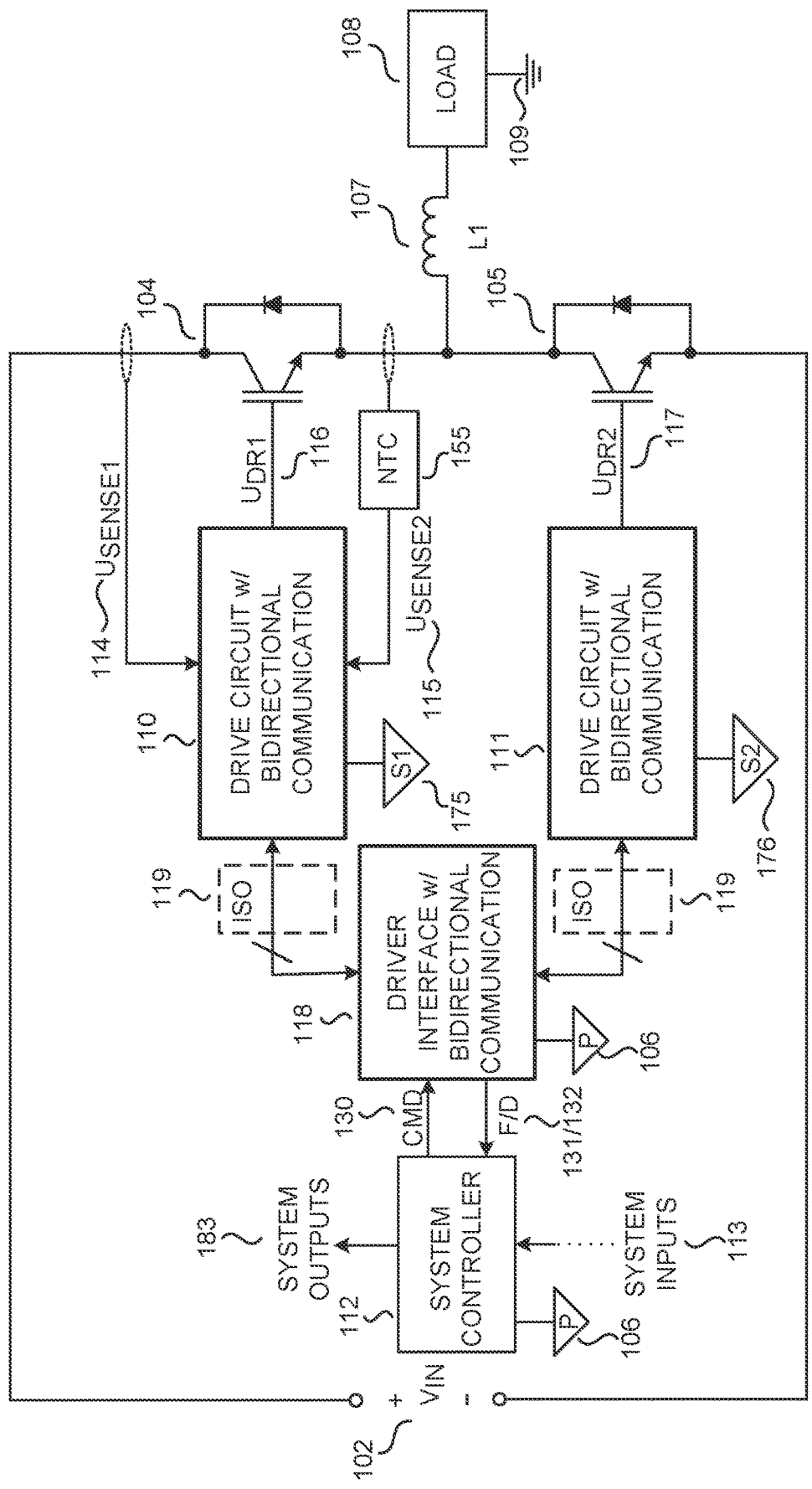
FIG. 1 illustrates an example power conversion system utilizing a controller with bidirectional communication between a driver interface and a drive circuit in accordance with an embodiment of the present disclosure.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

As described above, electrical devices may include an inductive coupling that provides a communications channel between a transmitter and a receiver that are galvanically isolated from one another. However, an inductive coupling communications channel may have certain limitations. For example, because the transmitter and the receiver are galvanically isolated, it may be costly to provide both the transmitter and the receiver with a clock signal. Communications across an inductive coupling communications channel are thus generally asynchronous and different transmitters can attempt to transmit a signal at the same time.

This specification describes inductive coupling communications channels that can address some of these limitations. For example, multiple transmitters and receivers can be coupled to an inductive coupling and access the communications channel that it provides. In effect, the inductive coupling can provide multiple channel access. In some cases, the transmitters can transmit asynchronously, i.e., without a clock signal or other timing mechanism that ensures that their respective transmissions do not collide. In some cases, the signals transmitted can have different priorities so that signals that are more important to the operation of a device are conveyed more reliably than signals that are less important.

The inductive coupling communications channels can be implemented in a variety of different devices, including power conversion systems in which a switch controller controls the switching of a power switch. In some such power conversion systems, the power switch may be an insulated-gate bipolar transistor (IGBT) controlled by an IGBT driver. In some cases, the switch controller may include a driver interface and a drive circuit that are coupled to communicate across galvanic isolation using the inductive coupling communications channel. The inductive coupling can be implemented as a signal transformer or other coupled inductors. The driver interface may be on the primary side of the transformer while the drive circuit may be on the secondary side. The power conversion system may also include a system controller, which controls one or more switch controllers.

The driver interface may be coupled to receive one or more input signals from a system controller and provide one or more output signals to the system controller. In one example, the driver interface receives a command signal from the system controller regarding switching the power switch between an ON state and OFF state. The command signal is then communicated to the drive circuit across the galvanic isolation via the inductive coupling communications channel to drive the switching of the power switch. In other words, the command signal is communicated from the primary to the secondary of the power converter.

The drive circuit may be coupled to receive a fault signal representative of a fault condition of the power converter, such as an overcurrent or overvoltage condition of the power switch. The fault signal is communicated across the galvanic isolation via the inductive coupling communications channel from the drive circuit to the driver interface. The driver interface then outputs the fault signal to the system controller. In other words, the fault signal is communicated from the secondary to the primary of the power converter. An indication of the fault by the fault signal may trigger the system controller to immediately turn off the power switch or the driver may turn off the power switch independently of the fault signal transmission.

Operating conditions of the power switch or the power converter, such as temperature or voltage of the power switch, the input voltage of the converter, or the load current of the power switch, may also be communicated from secondary to the primary of the power converter. This can be referred to as data and the corresponding communications as data signals. In embodiments of the present disclosure, data signals regarding the operating conditions of the power switch/converter may be communicated by the driver circuit to the driver interface across the galvanic isolation via the same inductive coupling communications channel that communicates fault signals and command signals. As such, the driver interface and the drive circuit are capable of bidirectional communication and may eliminate the need for additional hardware. Thus, a driver circuit can communicate both a fault signal and data signals across the galvanic isolation via a single inductive coupling communications channel.

In some implementations, a driver interface is coupled to the primary winding of the inductive coupling whereas the drive circuit is coupled to the secondary winding of the inductive coupling. In one embodiment, the driver interface transmits a command signal to the drive circuit by applying a voltage to the primary winding, which induces a voltage and current in the secondary winding. Further, the drive circuit transmits both the fault signal and the data signal to the driver interface via the inductive coupling. In one example, the drive circuit sends a fault signal by providing current to flow in a first direction through the secondary winding of the inductive coupling and sends a data signal by providing current to flow in a second direction through secondary winding of the inductive coupling, wherein the first direction and second direction are opposite of each other. The driver interface receives and differentiates the fault signal and the data signal by the direction of the received induced current in the primary winding of the inductive coupling.

In one embodiment, the transmission of the command signal, fault signal, and data signal are not synchronized. As such, the duration and/or magnitude may be selected to manage collisions if the signals are transmitted at the same time. The duration and/or magnitude may be selected to operate in the high power/high noise environment like a power converter. In one example, the duration and/or magnitude of the fault signal is relatively long/large as compared to either the command signal or the data signal such that the fault signal will dominate. The magnitude of the command signal may be relatively large compared to the data signal but the duration may be relatively small as compared to either the fault signal or the data signal. Further, the data signal may have a relatively small magnitude but long duration as compared to either the fault signal or the command signal.

FIG. 1 illustrates an example power conversion 100 that includes a driver interface with bidirectional communication 118 and drive circuits with bidirectional communication 110, 111. Power converter 100 receives an input voltage 102

(VIN) and is designed to transfer electrical energy from the input to a load 108 through an energy transfer element L1 107 by controlling the switching of power switches 104, 105. In various implementations, the power converter 100 can control voltage, current, or power levels of the energy output to the load 108. In the example shown in FIG. 1, energy transfer element L1 106 and two power switches 104, 105 are coupled together in a half-bridge configuration. However, other topologies can also be used.

In the example shown in FIG. 1, power switches 104, 105 are IGBTs. However, examples of the present invention can also be used in combination with other power switches. For example, metal-oxide-semiconductor field-effect transistors (MOSFETs), bipolar transistors, injection enhancement gate transistors (IEGTs) and gate turn-off thyristors (GTOs) can be used. In addition, power converter 100 can be used with power switches which are based on gallium nitride (GaN) semiconductors or silicon carbide (SiC) semiconductors.

System controller 112 is coupled to receive system inputs 113 and provide system outputs 183. The system controller 112 determines whether the switch controllers (shown as the driver interface 118 and drive circuits 110, 111) should turn on or turn off the power switches 104, 105 based on the system inputs 113. Example system inputs 113 include pulse width modulated (PWM) signal for a general purpose motor drive, a turn-on and turn-off sequence of a multi-level power converter, or a system fault turn-off request.

In the illustrated power converter 100, the system controller outputs one or more commands CMD 130 to the drive interface 118 of the switch controller. Command CMD 130 may be a rectangular pulse waveform that includes logic high and logic low sections of varying durations. For example, logic high values may indicate that power switch 104 should be in the ON state while logic low values may indicate that power switch 104 should be in the OFF state. Power switch 105 is switched alternately with power switch 104 so that both are not in the ON state at the same time. Indeed, power switches 104, 105 are generally controlled to have a dead time where both are in the OFF-state between switching transitions. In any case, the durations of the logic high/logic low values can correspond to the desired driving of power switches 104, 105.

Power switches 104, 105 are each controlled by the driver interface with bidirectional communication 118 and a drive circuit with bidirectional communication (110, 111 respectively). Although FIG. 1 illustrates a single driver interface 118, it should be appreciated that each drive circuit 110, 111 may have its own driver interface. The driver interface 118 and the system controller 112 are both referenced to a primary reference potential 106 while the drive circuit 110 is referenced to a secondary reference potential 175 and the drive circuit 111 is referenced to a secondary reference potential 176. Secondary reference potentials 175, 176 are different potentials. The drive circuits 110, 111 bidirectionally communicate with the driver interface 118 and are also galvanically isolated from the driver interface 118 by isolated communication links 119. The isolated communication links may be implemented as a signal transformer, coupled inductors, or other inductive coupling.

Driver interface 118 interprets the command CMD 130 sent by the system controller 112 and sends a command signal to instruct drive circuits 110, 111 to drive power switches 104, 105 into the ON and OFF states, respectively, via the isolated communication links 119. The drive circuits 110, 111 receive their respective command signals and generate the first drive signal $U_{DR1}$ 116 and the second drive signal $U_{DR2}$ 117 to drive power switches 104, 105.

In general, drive circuits 110, 111 can have corresponding structures and perform corresponding operations. However, for the sake of brevity, a detailed description of the drive circuit 111 is omitted from the following discussion, which refers only to drive circuit 110.

Drive circuit 110 receives a first sense signal $U_{SENSE1}$ 114 and a second sense signal $U_{SENSE2}$ 115. The first and second sense signals $U_{SENSE1}$ 114, $U_{SENSE2}$ 115 are representative of operational conditions of the power switch 104 and may be referred to as data. In the example shown, the first sense signal $U_{SENSE1}$ 114 is representative of the collector-to-emitter voltage of power switch 104 while the second sense signal $U_{SENSE2}$ 115 is representative of the temperature of the power converter as measured by the temperature sensor NTC 155. Other example operating conditions include the gate-emitter voltage of the power switch, the current flowing through the power switch, or the load current of L1 107. Drive circuit 110 may detect a fault condition or receive fault signals (not shown) that are representative of an overvoltage or overcurrent fault in the respective power switches 104, 105. The fault signal and the data provided by the first and second sense signals $U_{SENSE1}$ 114, $U_{SENSE2}$ 115 are communicated from the drive circuit 110 to the driver interface via the communication link 119. The command signal is transmitted from the primary side of the power converter 100 to the secondary side of the power converter 100 while fault and data are transmitted from the secondary side of the power converter 100 to the primary side of the power converter 100. As such, the communication across the isolating communication link 119 is bidirectional.

Driver interface 118 receives the fault signal and data signals from the drive circuit 110 and converts and outputs data signal D 132 and (if appropriate) fault signal F 131 to system controller 112. The system controller 112 may use the received signals to determine whether to turn on or turn off power switches 104, 105. The determination whether to turn on or turn off power switches 104, 105 may also be made, e.g., by drive circuit 110.

Figure 2A:
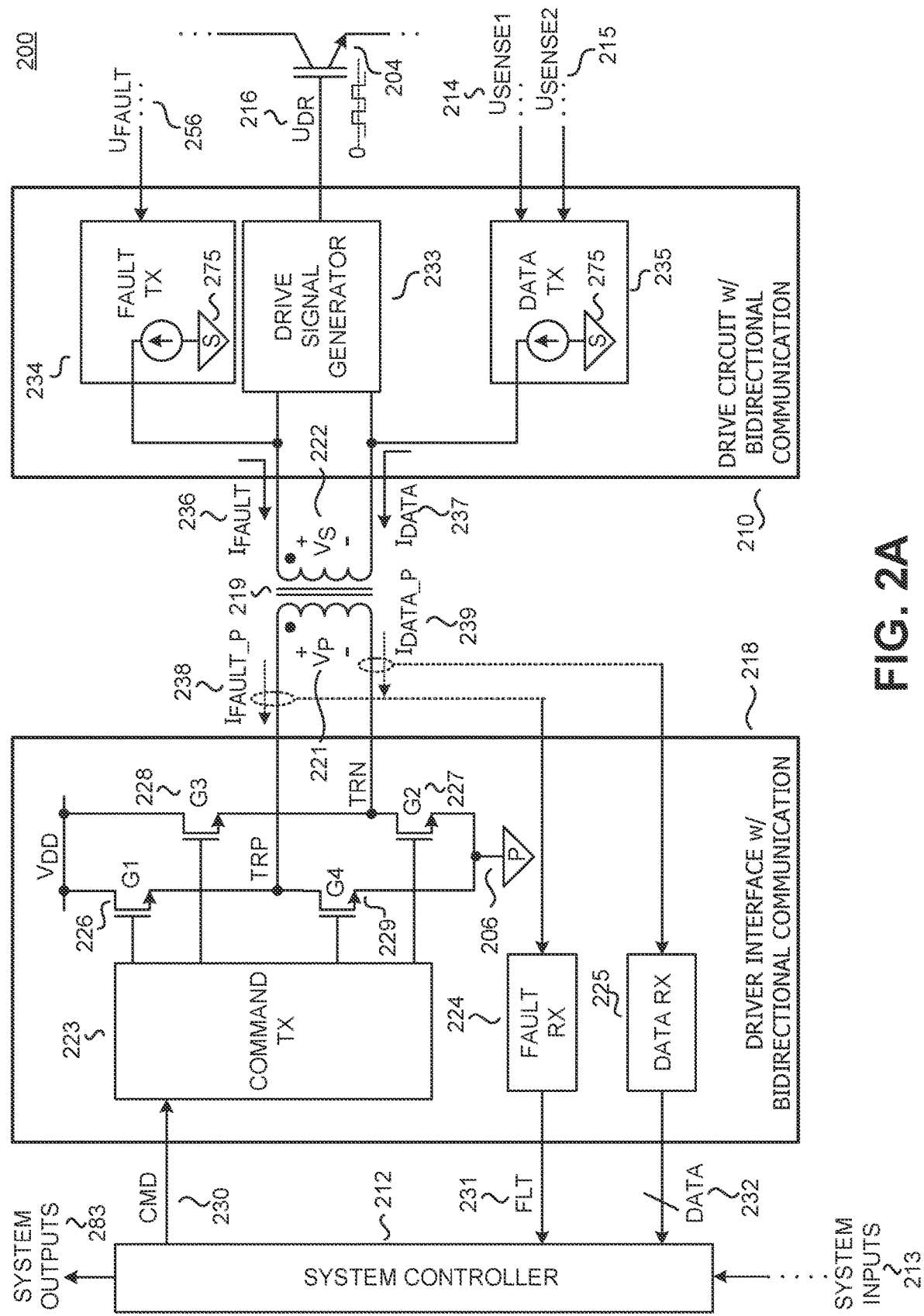
FIG. 2A illustrates an example controller with bidirectional communication between a driver interface and a drive circuit of FIG. 1 in accordance with an embodiment of the present disclosure.

FIG. 2A illustrates an example switch controller 200 with bidirectional communication between the driver interface 218 and the drive circuit 210. The inductive coupling of communication link 219 is implemented as a signal transformer with a primary winding and secondary winding. The voltage across the primary winding is labeled as the primary voltage $V_P$ 221 while the voltage across the secondary winding is labeled as secondary voltage Vs 222. The dots on the inductive coupling that forms communication link 219 represent the direction of current and polarity of voltage that one winding of a signal transformer induces in the other. It should be appreciated that similarly named and numbered elements are coupled and function as described above. Further, the system controller 212 and the power switch 204 are illustrated in FIG. 2A to provide context for the driver interface 218 and the drive circuit 210.

System controller 212 is coupled to receive system inputs 213 and provide system outputs 283. Further, the system controller 212 is coupled to output command signal CMD 230 to the driver interface 218 and receive fault signal FLT 231 and data signal DATA 232 from the driver interface. The system controller 212 may generate command CMD 230 in response to system inputs 213, fault signal FLT 231, and data signal DATA 232.

The illustrated driver interface 218 includes a command transmitter 223, a fault receiver 224, and a data receiver 225. Further shown are switches G1 226, G2 227, G3 228, and G4 229. The illustrated switches are n-type metal-oxide-semiconductor field effect transistors (MOSFETs) but it should be appreciated that other switches may be used. Switch G1 226 is coupled to a supply voltage $V_{DD}$ and the dot-end of the primary winding of transformer 219. Switch G2 227 is coupled to primary reference 206 the end of the primary winding without the dot. Switch G3 228 is coupled to the supply voltage $V_{DD}$ and the end of the primary winding without the dot. Switch G4 229 is coupled to primary reference 206 and the dot-end of the primary winding of transformer 219. As shown, the input/output terminal of the driver interface 218 which is coupled to transistors G1 226, G4 229 is labeled with TRP while the input/output terminal of the driver interface 218 which is coupled to transistors G2 227, G3 228 is labeled with TRN.

The command transmitter 223 is coupled to receive command CMD 230 from the system controller 212 and generate control signals for each of the switches G1 226, G2 227, G3 228, and G4 229. The voltage generated across the primary winding of transistor 219 by the control of switches G1 226, G2 227, G3 228, and G4 229 can instruct drive circuit 210 to drive power switch 204. In one example, command transmitter 223 responds to a logic high command signal CMD 230 by transmitting an ON command that instructs drive circuit 210 to drive power switch 204 into an ON state and to a logic low command signal CMD 230 by transmitting an OFF command that instructs drive circuit 210 to drive power switch 204 into an OFF state. For example, in response to receiving a rising edge in command CMD 230, command transmitter 223 can control switches G1 226, G2 227 into a conductive ON state and control switches G3 228, G4 229 into a non-conductive OFF state for a fixed amount of time. As a result, the dot-end of primary winding is coupled to the supply voltage $V_{DD}$ and the other end is coupled to primary reference 206. Voltage $V_{DD}$ is thus applied to the primary winding for a fixed amount of time. In other words, there is a positive pulse in primary voltage $V_P$ 221 of a magnitude that is substantially equal to voltage $V_{DD}$. In response to receiving a falling edge in command CMD 230, command transmitter 223 can control switches G3 228, G4 229 into a conductive ON state and switches G1 226, G2 227 into a non-conductive OFF state for a fixed amount of time. As a result, the dot-end of the primary winding is coupled to the primary reference 206 and the other end is coupled to supply voltage $V_{DD}$. A negative reference voltage $-V_{DD}$ is thus applied to the primary winding for a fixed amount of time. In another words, there is a negative pulse in primary voltage $V_P$ 221 of a magnitude that is substantially equal to voltage $V_{DD}$.

When the command transmitter 223 is not transmitting an ON command or an OFF command (i.e., in an idle state), the command transmitter 223 either a) turns on switches G2 227, G4 229 and turns off switches G1 226, G3 228 or b) turns off switches G2 227, G4 229 and turns on switches G1 226, G3 228. This may be done to improve the noise immunity of the communications across the transformer 219.

As will be further discussed, a fault receiver 224 is coupled to the dot-end of the primary winding of transformer 216 to sense an induced current and a data receiver 225 is coupled to the end of the primary winding without the dot to sense an induced current. These induced currents represent fault and data signals, respectively.

Drive circuit 210 includes the drive signal generator 233, a fault transmitter 234, and a data transmitter 235. Drive signal generator 233 is coupled to the secondary winding and senses the secondary voltage Vs 222 across the secondary winding of transformer 219. A changing voltage across the primary winding induces a voltage across the secondary winding. Drive signal generator 233 senses the induced secondary voltage Vs 222 to determine if the command transmitter 223 sends an ON command or an OFF command. Drive signal generator 233 also generates a responsive drive signal $U_{DR}$ 216 to drive the power switch 204 accordingly.

Fault transmitter 234 is coupled to receive a fault control signal $U_{FAULT}$ 256. The fault control signal $U_{FAULT}$ 256 may indicate an overcurrent (e.g., an overload or short-circuit) or overvoltage fault in the power switch 204. In one example, the fault control signal $U_{FAULT}$ 256 is a rectangular pulse waveform that includes logic high and logic low sections of varying lengths. In response to a fault, the fault control signal $U_{FAULT}$ 256 may transition to a logic high value. In response to the fault control signal $U_{FAULT}$ 256, fault transmitter 234 generates a fault signal 236 to communicate the presence of a fault to the driver interface 218. The fault transmitter 234 is referenced to a secondary reference 275. Fault transmitter 234 may be implemented as a switchable current source that provides a fault current $I_{FAULT}$ 236 in response to the fault control signal $U_{FAULT}$ 256. In the illustrated implementation, fault current $I_{FAULT}$ 236 flows into the dot-end of the secondary winding and induces a primary side fault current $I_{FAULT\_P}$ 238 which flows out of the dot-end of the primary winding. The magnitude of the primary side fault current $I_{FAULT\_P}$ 238 is related to the secondary side fault current $I_{FAULT}$ 236 by the turns ratio of the signal transformer 219. Fault receiver 224 senses the primary side fault current $I_{FAULT\_P}$ 238, identifies that the primary side fault current $I_{FAULT\_P}$ 238 is indicative of a fault on the secondary side, and outputs a signal FLT 231 to the system controller 212.

In the illustrated implementation, data transmitter 235 is coupled to receive a first sense signal $U_{SENSE1}$ 214 and a second sense signal $U_{SENSE2}$ 215. Both sense signals are representative of operating conditions of the power switch 204. Data transmitter 235 encodes the data provided by the first sense signal $U_{SENSE1}$ 214 and the second sense signal $U_{SENSE2}$ 215 and generates a data signal $I_{DATA}$ 237 that embodies that data. Data signal $I_{DATA}$ 237 induces a corresponding primary side data current $I_{DATA\_P}$ 239 and thereby conveys information to the driver interface 218 via an inductive coupling 219. In some implementations, the information is encoded in a binary word. For example, logic high pulses in the data signal $I_{DATA}$ 237 can indicate binary "1s" and logic low pulses or no pulse can indicate binary "0s." In some implementations, the data signal $I_{DATA}$ 237 comports with a universal asynchronous receiver transmitter (UART) protocol. In some implementations, an error-correcting code such as a Hamming code or cyclic redundancy check (CRC) code can be used.

The data transmitter 235 is referenced to secondary reference potential 275 and may be implemented as a current source that provides data current signal $I_{DATA}$ 237. Data current signal $I_{DATA}$ 237 flows into a different end of the secondary winding from fault current $I_{FAULT}$ 236, namely, the end of the secondary winding without the dot in the illustrated implementation. The secondary side data current $I_{DATA}$ 237 induces a primary side data current $I_{DATA\_P}$ 239 which flows from the opposite end of the dot in the primary winding. The magnitude of the primary side data current $I_{DATA\_P}$ 239 is related to the magnitude of the secondary side data current $I_{DATA}$ 237 by the turns ratio of the signal transformer 219. Data receiver 225 senses the primary side data current $I_{DATA\_P}$ 239 and decodes the received signal. The decoded information is conveyed to the system controller as DATA 232. As will be discussed further below, the magnitude and the duration of the command signals sent by the command transmitter 223 (i.e., primary voltage $V_P$ 221), the fault signals sent by the fault transmitter 234 (i.e., fault current $I_{FAULT}$ 236), and the data signals sent by the data transmitter 235 (i.e., data current $I_{DATA}$ 237) may be chosen so that these signals can be differentiated even in the event of firsts between them. Driver interface 218 and drive circuit 210 thus need not be synchronized or limited to transmitting information in accordance with a time sharing scheme. Rather, the communications channel formed by inductive coupling 219 can provide simultaneous access to multiple transmitters that transmit data asynchronously.

FIG. 2B is a table 201 of example current and voltage values for the command signals, fault signal, and data signals input into signal transformer 219 for an example implementation. It should be appreciated that the polarities of the currents are consistent with their illustration in FIG. 2A. The polarities of the primary voltage $V_P$ 221 and secondary voltage Vs 222 are also consistent with their illustration FIG. 2A.

The first row of the table 201 sets forth the primary voltage $V_P$ 221 for a transmitted ON command and a transmitted OFF command in the example implementation. For an ON command, the primary voltage $V_P$ 221 is substantially $+V_{DD}$ for a period T1. For an OFF command, the primary voltage $V_P$ 221 is substantially $-V_{DD}$ for a period T1. In the example implementation, $V_{DD}$ is substantially 15 volts (V) and period T1 is substantially 200 nanoseconds (ns). Although the example ON and OFF commands have an equal duration but opposite polarity, it should be appreciated that a variety of different polarities and durations may be used in other implementations.

The second row of table 201 sets forth the secondary winding current for a transmitted fault current $I_{FAULT}$ 236 in the example implementation. In response to a fault, the magnitude of the fault current $I_{FAULT}$ 236 is substantially equal to $-I_2$ for a period T2. In the absence of a fault, the fault current $I_{FAULT}$ 236 can be substantially equal to zero. The duration of period T2 is greater than the duration of period T1 for the command signals. In the example implementation, $I_2$ is substantially equal to 170 milliamps (mA) and the duration of period T1 is substantially equal to 4.4 microseconds (us). However, in other implementations, different polarities and durations may be used. For example, the windings of the transformer may be wrapped in the opposite direction around the core. Also, in other implementations, a no fault condition may be another magnitude and/or may have a predetermined duration.

The third row of table 201 sets forth the secondary winding current for a transmitted data current $I_{DATA}$ 237 in the example implementation. In the example implementation, the data is encoded in a binary word. The data current $I_{DATA}$ 237 is substantially equal to +13 for period T3 to transmit a binary "1." Data current $I_{DATA}$ 237 is substantially zero to transmit a binary "0." Further, the duration of period T3 is greater than the duration of period T1. In the example implementation, $+I_3$ is substantially 30 mA and period T3 has a duration of 14 us. However, in other implementations, different polarities and durations may be used. Also, a "0" transmission may be another magnitude and/or may have a predetermined duration.

Figure 3A:
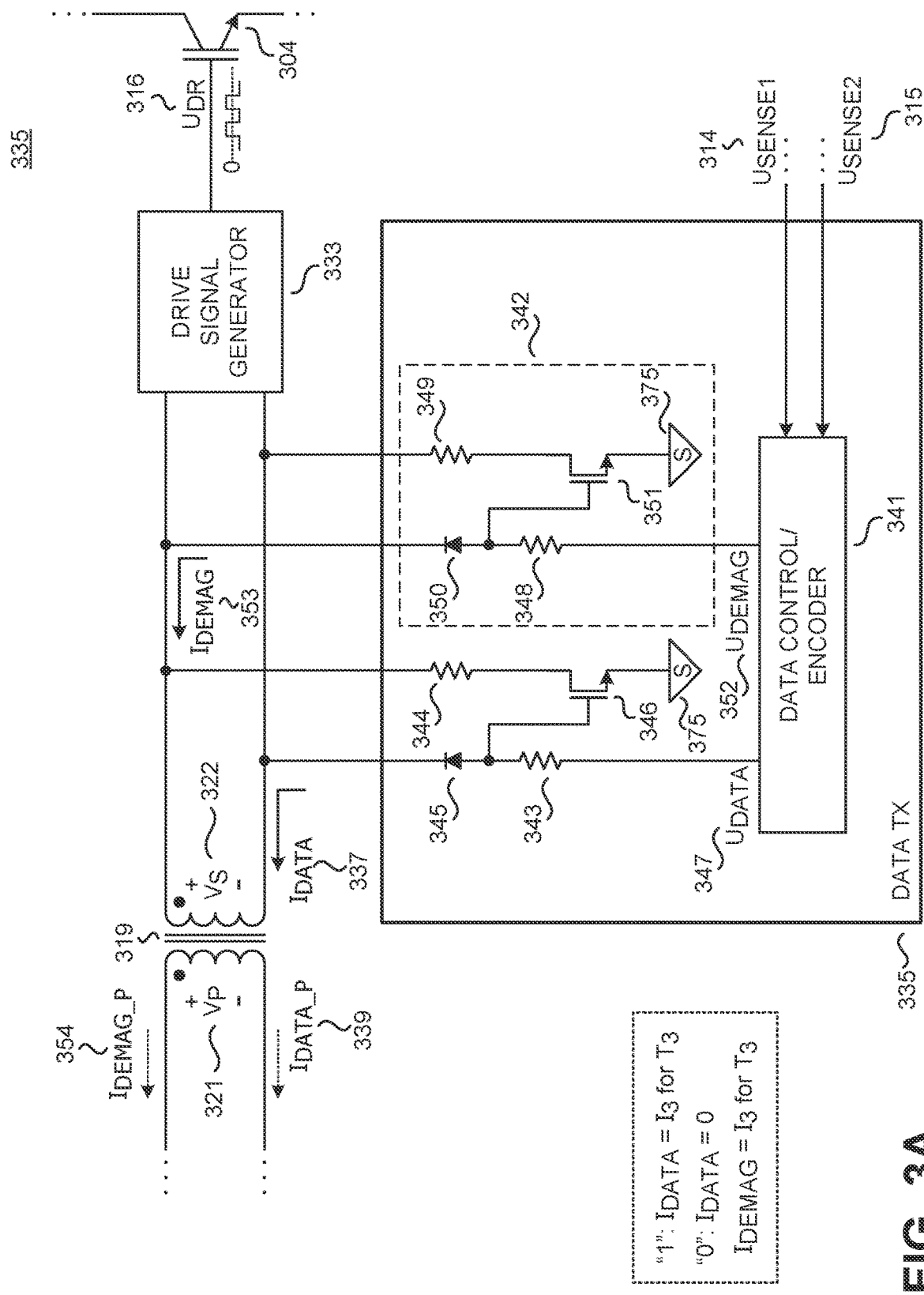
FIG. 3A illustrates an example data transmitter of FIG. 2A in accordance with an embodiment of the present disclosure.

FIG. 3A illustrates a data transmitter 335, which is one example of data transmitter 235 shown in FIG. 2A. It should be appreciated that similarly named and numbered elements are coupled and function as described above. Further, an inductive coupling 319, a drive signal generator 333, and a power switch 304 are illustrated to provide context for the data transmitter 335.

The data transmitter 335 includes a data control/encoder 341, a switch 346 (illustrated as an n-type MOSFET), resistances 343, 344, and a diode 345. Resistance 343 is coupled to the data control/encoder 341 and the control terminal of switch 346. Diode 345 is coupled to resistance 343 and the end of the secondary winding without the dot. Resistance 344 is coupled to the dot-end of the secondary winding and the switch 346. Switch 346 is coupled between resistor 344 and secondary reference 375.

Data transmitter 335 may also include an optional demagnetization circuit 342 to demagnetize the transformer 319. Demagnetization may prevent transformer 319 from going into saturation. Demagnetization circuit 342 includes a switch 351 (illustrated as an n-type MOSFET), resistances 348, 349, and a diode 350. Resistance 348 is coupled to the data control/encoder 341 and the control terminal of switch 351. Diode 350 is coupled to resistance 348 and the dot-end of the secondary winding. Resistance 349 is coupled to the end of the secondary winding without the dot and the switch 351. Switch 351 is coupled between resistor 349 and secondary reference 375.

The data control/encoder 341 receives the first and second sense signals $U_{SENSE1}$ 314, $U_{SENSE2}$ 315 and encodes at least some of the data provided by these signals. The data control/encoder 341 may optionally include an analog-to-digital converter to convert the data into a digital value, a SPI (Serial Peripheral Interface), an I2C interface, or other digital interface to receive data from a digital sensor. In some implementations, data control/encoder 341 may apply a universal asynchronous receiver transmitter (UART) protocol. In some implementations, data control/encoder 341 may use an error-correcting code such as a Hamming code or cyclic redundancy check (CRC) code.

Data control/encoder 341 controls switch 346 into and out of conduction to generate data current $I_{DATA}$ 337. In one embodiment, data control signal $U_{DATA}$ 347 is logic high when transmitting a binary "1" and logic low when transmitting a binary "0." Or in other words, the data control signal $U_{DATA}$ 347 switches the switch 346 into conduction to transmit a binary "1" and switches the switch 346 out of conduction to transmit a binary "0." The inverse polarity can also be used. When the data control signal $U_{DATA}$ 347 turns on the switch 346, current flows through resistor 343, diode 345 and into the end of the secondary winding without the dot. The current flows out of the dot-end of the secondary winding and through resistor 344 and switch 346 to secondary reference 375. In one example, the magnitude of data current $I_{DATA}$ 337 is substantially equal to 13 and switch 346 is turned on for period T3. The data current $I_{DATA}$ 337 induces a primary side data current $I_{DATA\_P}$ 339 which flows out of the end of the primary winding without the dot.

The transmitted data current $I_{DATA}$ 337 may magnetize and eventually saturate the transformer 319. Demagnetization circuit 342 may demagnetize the transformer 319 intermittently or every time the data transmitter 355 transmits a binary "1." The demagnetization circuit 342 demagnetizes the transformer 319 by sending a demagnetization current $I_{DEMAG}$ 353 of equal value to the data current $I_{DATA}$ 337 but in the opposite direction through the secondary winding. In the example shown, the demagnetization current $I_{DEMAG}$ 353 flows into the dot end of the secondary winding. The equal and opposite demagnetization current $I_{DEMAG}$ 353 may be transmitted before or after a binary "1" data current $I_{DATA}$ 337 or when necessary. When the switch 351 is turned on, demagnetization current $I_{DEMAG}$ 353 flows through resistor 348, diode 350 and into the dot-end of the secondary winding. The demagnetization current $I_{DEMAG}$ 353 flows out of the secondary winding and through resistor 349 and switch 351 to secondary return 375. In some implementations, the values of resistances 343 and 348 may be substantially equal and the value of resistances 344 and 349 may be substantially equal. In other implementations, they may have different values.

Figure 3B:
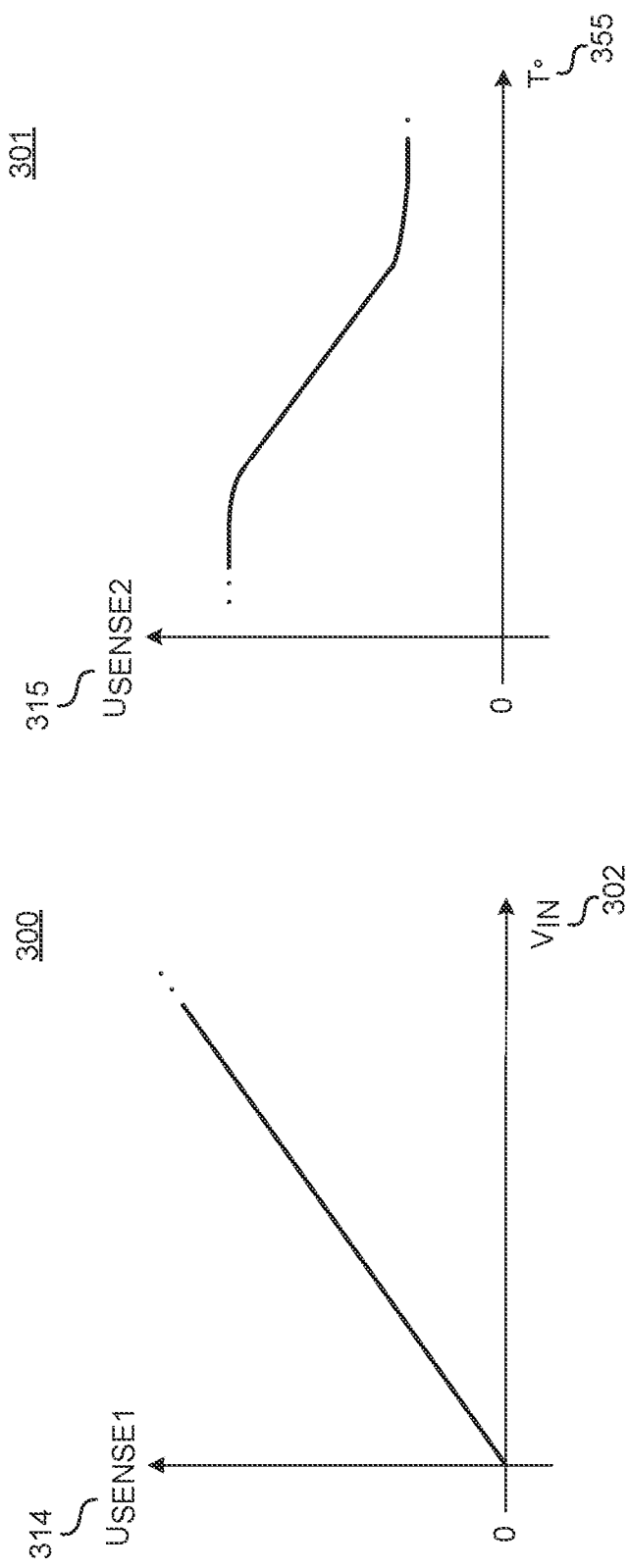
FIG. 3B illustrates example sense signals of FIGS. 1, 2A, and 3A in accordance with an embodiment of the present disclosure.

FIG. 3B illustrates example first and second sense signals $U_{SENSE1}$ 314, $U_{SENSE2}$ 315. In one example, the first sense signal $U_{SENSE1}$ 314 is representative of the input voltage VIN 302 and may increase as the input voltage VIN 302 increases. The second sense signal $U_{SENSE2}$ 315 is representative of temperature and may decrease as the temperature increases.

Figure 4:
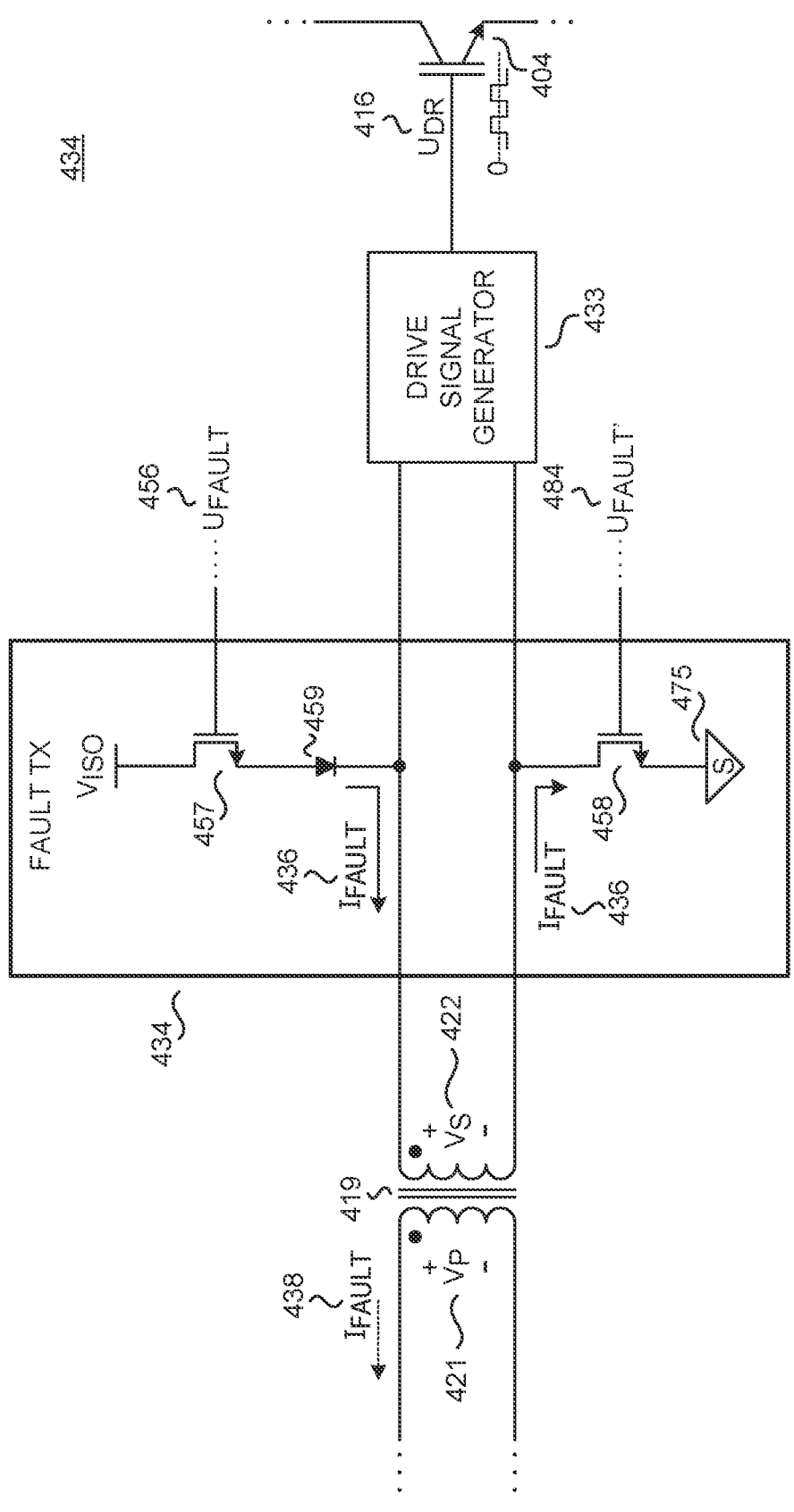
FIG. 4 illustrates an example fault transmitter of FIG. 2A in accordance with an embodiment of the present disclosure.

FIG. 4 illustrates a fault transmitter 434, which is one example of the fault transmitter 234 shown in FIG. 2A. It should be appreciated that similarly named and numbered elements couple and function as described above. Further, an inductive coupling 419, a drive signal generator 433, and a power switch 404 are illustrated to provide context for fault transmitter 434.

The fault transmitter 434 includes switches 457, 458 (illustrated as n-type MOSFETs) and a diode 459. Switch 457 is coupled between a supply voltage VISO and diode 459. Further, switch 457 is controlled by fault control signal $U_{FAULT}$ 456. Diode 459 is coupled to the dot-end of the secondary winding of inductive coupling 419. The switch 458 is coupled to the other end of the secondary winding (without the dot) and is referenced to secondary reference 475. Switch 458 is controlled by shifted fault control signal $U_{FAULT'}$ 484.

The fault control signal $U_{FAULT}$ 456 and shifted fault control signal $U_{FAuLT}$ 484 are synchronized and, in some implementations, can be output from a single source. In response to sensing a fault, both fault control signal $U_{FAULT}$ 456 and shifted fault control signal $U_{FAULT'}$ 484 can be transitioned to a logic high state that controls switches 457, 458 into a conductive state. Fault current $I_{FAULT}$ 436 flows through switch 457, diode 459, and into the dot-end of the secondary winding of transformer 419. Fault current $I_{FAULT}$ 436 also flows out of the opposite end of the secondary winding and to secondary reference 475 through switch 458. The magnitude of the fault current $I_{FAULT}$ 436 is substantially equal to current I2 and the switches 457, 458 are turned on for period T2.

Figure 5:
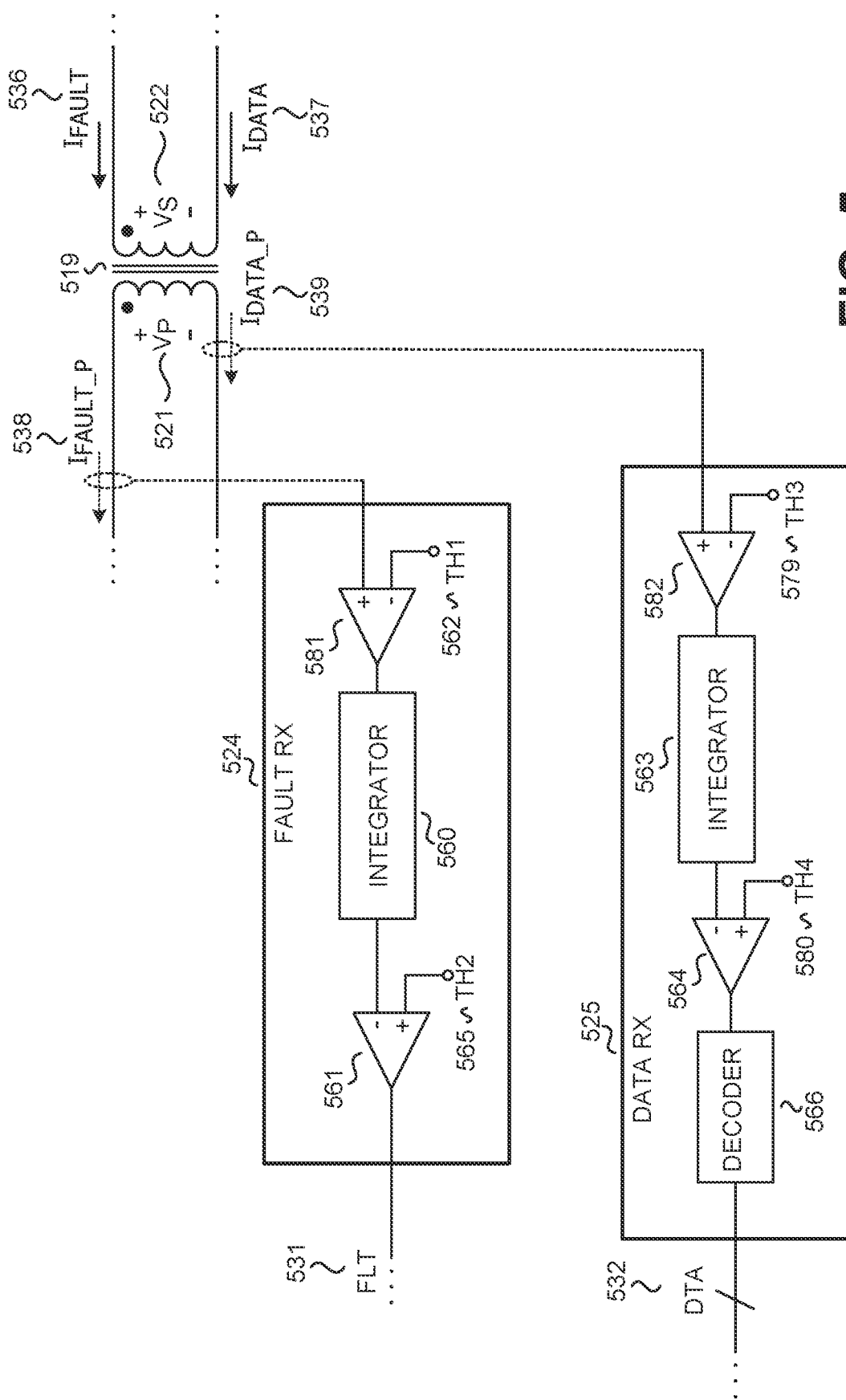
FIG. 5 illustrates an example fault receiver and data receiver of FIG. 2A in accordance with an embodiment of the present disclosure.

FIG. 5 illustrates a fault receiver 524 and data receiver 525, which are examples of the fault and data receiver 224, 225 shown in FIG. 2A. It should be appreciated that similarly named and numbered elements are coupled and function as described above. Further, an inductive coupling 519 is illustrated to provide context for the fault receiver 524 and data receiver 525.

The fault receiver 524 is shown as including a comparator 581, an integrator 560, and a comparator 561. The fault receiver 524 is coupled to the dot-end of the primary winding of transformer 519. As mentioned above, a transmitted fault current $I_{FAULT}$ 536 on the secondary induces a primary side fault current $I_{FAULT}$ P 538. The primary side fault current $I_{FAULT}$ P 538 is sensed by the fault receiver 524. In one example, the primary side fault current $I_{FAULT}$ P 538 may be sensed by a current sensing resistance or MOSFET. For example, the fault current $I_{FAULT}$ P 538 may be sensed by sensing the drain-source voltage of transistor G4 shown in FIG. 2A.

The sensed primary side fault current $I_{FAULT\_P}$ 538 and a first threshold TH1 562 is received by comparator 581. As shown, the primary side fault current $I_{FAULT\_P}$ 538 is received at the non-inverting input while the first threshold TH1 562 is received at the inverting input of comparator 581. The output of comparator 581 is received by integrator 560. In the illustrated example, integrator 560 integrates with an upward slope up to a maximum value when the sensed primary side fault current $I_{FAULT}$ P 538 is greater than the first threshold TH1 562. The integrator 560 integrates with a downward slope to a minimum value when the sensed primary side fault current $I_{FAULT}$ P 538 is less than the first threshold TH1 562. As will be further discussed, the first threshold TH1 562 may be within the range of 100-145 mA. For an example where the sensed primary side fault current $I_{FAULT\_P}$ 538 is a voltage signal, the first threshold TH1 562 may be a range of voltage values which correspond to a current value of 100-145 mA.

In operation, when the sensed primary side fault current $I_{FAULT}$ P 538 is greater than the first threshold TH1 562, comparator 581 outputs a high signal that is integrated with an upward slope up to a maximum value by integrator 560. When the sensed primary side fault current $I_{FAULT}$ P 538 is less than the first threshold TH1 561, comparator 581 outputs a low signal and integrator 560 is discharged with a downward slope down to a minimum value. The integration result is output from integrator 560.

Comparator 561 is coupled to receive the output of integrator 560 and a second threshold TH2 565. As shown, the output of integrator 560 is received at the inverting input of comparator 561 and the second threshold TH2 565 is received at the non-inverting input. In response to the output of integrator 560 rising above second threshold TH2 565, comparator 561 outputs a logic high fault signal FLT 531. In response to the output of integrator 560 being below second threshold TH2 565, comparator 561 outputs logic low fault signal FLT 531. The second threshold TH2 465 may be representative of a time threshold for the amount of time which the sensed primary side fault current $I_{FAULT\_P}$ 538 is greater than the first threshold TH1 562. For example, the second threshold TH2 565 may correspond to an amount of time between 790-1620 ns. Signal FLT 531 is conveyed to the system controller (not shown). Thus, when the output of integrator 560 is greater than the second threshold TH2 565, fault receiver 524 indicates that a fault was transmitted from the driver circuit on the secondary.

Data receiver 525 includes a comparator 582, an integrator 563, a comparator 564, and a decoder 566. Data receiver 525 is coupled to the end opposite of the dot-end of the primary winding of transformer 519. As mentioned above, a transmitted data current signal $I_{DATA}$ 537 from the driver circuit induces a primary side data current $I_{DATA}$ P 539. The primary side data current $I_{DATA}$ P 539 is sensed by data receiver 525. For example, the primary side data current $I_{DATA}$ P 539 may be sensed by a current sensing resistor or MOSFET.

The sensed primary side data current $I_{DATA}$ P 539 and a fourth TH3 579 is received by comparator 582. As shown, the primary side data current $I_{DATA}$ P 539 is received at the non-inverting input while the third threshold TH3 579 is received at the inverting input of comparator 582. As will be further discussed, the third threshold TH3 579 may be within the range of 10-20 mA. For an example where the sensed primary side data current $I_{DATA\_P}$ 539 is a voltage signal, the third threshold TH3 579 may be a range of voltage values which correspond to a current value of 10-20 mA. In operation, when the sensed primary side data current $I_{DATA\_P}$ 539 is greater than the third threshold TH3 579, comparator 582 outputs a high signal that is integrated with an upward slope up to a maximum value by integrator 563. When the sensed primary side data current $I_{DATA\_P}$ 539 is less than the third threshold TH3 579, comparator 582 outputs a low signal and integrator 563 is discharged with a downward slope down to a minimum value. The integration result is output from integrator 563.

Comparator 564 is coupled to receive the output of integrator 563 and a fourth threshold TH4 580. As shown, the output of integrator 563 is received at the inverting input of comparator 564 and the fourth threshold TH4 580 is received at the non-inverting input. The output of comparator 564 is logic high in response to output of integrator 564 rising above fourth threshold TH4 580. The output of comparator 564 is logic low in response to the output of integrator 564 being less than the fourth threshold TH4 580. The fourth threshold TH4 580 may be representative of a time threshold for the amount of time which the sensed primary data current $I_{DATA\_P}$ 539 is greater than the third threshold TH3 579. For example, the fourth threshold TH4 580 may correspond to an amount of time greater than 3.3-6.6 us. Successive logic high and logic low states on the output of integrator 564 can form a series of binary bits that represent of operating conditions on the secondary.

Decoder 566 receives the output of comparator 564 and decodes the series of bits sent by the data transmitter 525. Based on the information encoded in bits, decoder 566 outputs data DATA 532 to the system controller. The outputted data DATA 532 can be in the form of an analog signal, PWM signal, a bit stream, etc.

FIG. 6A is a table 600 setting forth one implementation of the magnitudes and durations—at transmission—of command signals, fault signals, and data signals that can embody their relative priorities of those signals in the event of collisions on the inductive coupling. As discussed above, the driver interface and driver circuit need not be synchronized and collisions between the signals may occur. As such, the nature of the signals may be selected to set a relative priority that determines which signals are received when a collision occurs. In effect, a lossy but multiple access communications channel can be implemented on the inductive coupling.

In the example shown in FIG. 6A, fault signals are prioritized over command and data signals. At least at the time of their transmission, command signals are prioritized over data signals. However, in general, the duration of data signal transmission is much longer and data will generally not be lost even with an intervening command signal. To implement these priorities, the fault signal at transmission can have relatively large (current) magnitude for a relatively long duration of time relative to the other signals. Details of an example fault signal are shown in the top row of table 600. Further, command signals can be implemented as voltage signals, in contrast with the fault and data current signals. Details of an example command signal at transmission are shown in the second row of table 600. Please note that command signals can be significantly shorter in duration than both fault and data signals. The individual bits that constitute data signals (and the associated demagnetization currents) are small in magnitude but have a relatively longer duration compared to fault signals and command signals. Details of an example data bit at transmission are shown in the third row of table 600, and details of an example demagnetization current are shown in the fourth row of table 600. It should be appreciated that the example fault and data, signals are current signals but the command signals are voltage signals. Nevertheless, these signals all induce a voltage or a current on the other side of the galvanic isolation provided by the inductive coupling.

In the example shown, fault current signals have a magnitude of $I_2$ substantially equal to 170 mA and period T2 has a duration of 4.4 us at transmission. The first threshold TH1 used to detect the fault current signal is within the range of 100-145 mA. Command voltage signals have a magnitude of supply voltage $V_{DD}$ substantially equal to 15V (which translates to a command current of magnitude Imp substantially equal to 70 mA) for period T1, which is substantially equal to 200 ns in duration. ON command signals have a positive polarity whereas OFF command signals have a negative polarity of equal magnitude. As discussed above, the ON and OFF command signals need be equal in duration and opposite in polarity. Data current bits have a magnitude of $I_3$ substantially equal to 30 mA and a period T3 with a duration of 14 us at transmission. The third threshold TH3 used to detect a data current bit is within the range of 10-20 mA. Demagnetization currents have magnitude of $I_3$ substantially equal to 30 mA and a period T3 with a duration that is substantially equal to 14 us. The polarity of the demagnetization currents is opposite the polarity of the data current bits.

FIG. 6B is a timing diagram 601 which schematically illustrates an example collision between signals that are transmitted on the inductive coupling simultaneously. As described above, at transmission on the secondary winding, a fault signal can have a magnitude of $I_2$ substantially equal to 170 mA and period T2 substantially equal to 4.4 us in duration. At transmission on the secondary winding, data current bits can have a magnitude of $I_3$ substantially equal to 30 mA and a period T3 with a duration that is substantially equal to 14 us, but a polarity that is opposite to the polarity of the fault signal. In one example, the magnitude of the fault current signals received at the primary winding may be referred to with magnitude $I_{2\_P}$. The range for the magnitude $I_{2\_P}$ is related to threshold TH1 (shown in FIG. 5). For example, the magnitude $I_{2\_P}$ for the primary side fault current should be greater than the first threshold TH1. In one example, the first threshold TH1 662 is within the range of 100-145 mA. For data bits, the magnitude of the signals received on the primary winding may be referred to as magnitude $I_{3\_P}$. The range for the magnitude $I_{3\_P}$ is related to threshold TH3 (shown in FIG. 5). For example, the magnitude $I_{3\_P}$ for the primary side data current should be greater than the third threshold TH3 679. In one example, the third threshold TH3 679 is within the range of 10-20 mA. Although the fault signals and data bits may have predetermined durations at transmission on the secondary side, the durations received on the primary side may vary due to noise and other conditions. For example, the duration of received fault current signals may be greater than 790-1620 ns to exceed time threshold TH2 (shown in FIG. 5) and the duration of received data bits may be greater than 3.3-6.6 us to exceed time threshold TH4 (shown in FIG. 5).

Timing diagram 601 illustrates a primary winding current 621 that includes a three-way collision between an ON command 668, a binary "1" data bit 639, and a fault signal 638. As shown, the ON command 668 collides with the binary "1" data bit 639 first. A fault signal 638 subsequently collides with the same binary "1" data bit 639. The polarity of the primary winding current 621 shown in FIG. 6B (and FIG. 6C) for current flowing into terminal TRN (i.e. to transistors G2 or G3 shown in FIG. 2A) is positive while current flowing out of terminal TRN (i.e. from transistors G2 or G3 shown in FIG. 2A) is negative.

For the illustrated example, a demagnetization current 654 is induced on the primary side before the binary "1" data bit 639. For the sake of simplicity, a magnetizing current is not shown FIGS. 6B and 6C. During the demagnetization current 654, the primary winding current is substantially −I$_{3\_P}$ 673 for period T3 674. After the demagnetization current 654 has finished, the binary "1" data bit 639 begins and the primary winding current 621 increases to substantially I$_{3\_P}$ 673 for period T3 674. The primary winding current is substantially I$_{3\_P}$ 673 for period T3 674 except during collisions with the ON command 668 and the fault signal 638. As shown, an ON command 668 is transmitted at the same time as the binary "1" data bit 639 is received. A spike in the primary winding current 621 is associated with the ON command 668 and the primary winding current 621 increases to a magnitude I$_{CMD}$ 669 for period T1 670. After the period T1 670, the primary winding current 621 decreases to substantially I$_{3\_P}$ 673. Since the ON command transition 668 is a voltage signal, it swamps the voltage associated with transmission of a binary "1" data bit 639 and the ON command 668 can be received on the secondary side notwithstanding the collision. In effect, during the transmission of an ON command, the ON command 668 is prioritized over the received binary "1" data bit 639. However, in general, the duration of data signal transmission is much longer than the ON command and data will generally not be lost even with an intervening ON command.

The fault signal 638 is received at the primary winding during the time that the binary "1" data bit 639 is received. As shown, the primary winding current 621 decreases to substantially −I$_{2\_P}$ 671 for period T2 672 in the midst of data bit 639. At the end of period T2 672, the primary winding current 621 increases to a magnitude substantially equal to 13_P 673 and remains at magnitude I$_{3\_P}$ 673 for the remainder of period T3 674. Since the polarity of the received fault signal 638 is opposite to the polarity of the received data bit 639, the fault signal can be discerned notwithstanding the collision. In effect, the polarity of fault signal 638 embodies a prioritization of the fault signal 638 over the binary "1" data bit 639.

FIG. 6C is another timing diagram that schematically illustrates a collision between an ON command 668, a fault signal 638, and a binary "1" data bit 639 on the primary side of a power converter. Similar to FIG. 6B, a demagnetization current 654 is induced on the primary side before the binary "1" data bit 639 is transmitted. During demagnetization 654, the primary winding current is substantially −I$_{3\_P}$ for period T3 674. After demagnetization 654 has finished, the binary "1" data bit 639 begins and the primary winding current 621 increases to substantially I$_{3\_P}$ for period T3 674. The primary winding current is substantially I$_{3\_P}$ 673 for period T3 674 except during collisions with an ON command 668 and a fault signal 638.

The fault signal 638 is received at the primary winding in the midst of a binary "1" data bit 639. As shown, the primary winding current 621 decreases to substantially −I$_{2\_P}$ 671 for period T2 672. During the received fault signal 638, an ON command 668 is transmitted during the period T2 672. A spike in the primary winding current 621 is associated with the ON command 668 and the primary winding current 621 increases for period T1 670. The peak of ON command 668 is substantially −I$_{2\_P}$ plus I$_{CMD}$. After the period T1 621, the primary winding current 621 decreases to substantially −I$_{2\_P}$ 671 and the fault signal 638 again predominates. At the end of period T2 672, the primary winding current 621 increases to a magnitude substantially equal to I$_{3\_P}$ 673 and remains at magnitude I$_{3\_P}$ 673 for the remainder of period T3 674. The respective magnitude and duration of the fault signal 638 and ON command signal 668 embodies a prioritization of fault signal 638 over the ON command signal 668. In particular, fault signal 638 can still be discerned by a fault receiver that integrates as described above.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example voltages, currents, frequencies, power range values, times, etc., are provided for explanation purposes and that other values may also be employed in other embodiments and examples in accordance with the teachings of the present invention.

What is claimed is:

1. A controller to control a power switch of a power converter, the controller comprising:
    a drive circuit configured to sense an operational parameter of the power switch, having a first reference potential;
    a driver interface having a second reference potential; and
    an inductive coupling comprising,
        a primary winding having a first primary terminal and a second primary terminal connected to the driver interface, wherein a signal on the first primary terminal is compared to a first threshold and a signal on the second primary terminal is compared to a second threshold, and
        a secondary winding having a first secondary terminal and a second secondary terminal connected to the drive circuit;
    wherein the driver interface is configured to compare at least a portion of the signal at one of the first and the second primary terminals with its respective threshold, and
    wherein the drive circuit is configured to drive current in a first direction in the secondary winding to transmit a first signal in response to the operational parameter.

2. The controller of claim 1, wherein the operational parameter is one of a collector-to-emitter voltage, a drain-to-source voltage, a system voltage, a temperature of the power switch, a load current, a collector current, and a drain current.

3. The controller of claim 2, wherein:
    the driver interface is further configured to compare at least a portion of the signal on the other of the first and the second primary terminals with its respective threshold, the portion of the signal at the first primary terminal has a first polarity relative to the first reference potential and the portion of the signal at the second primary terminal having a second polarity relative to the first reference potential and opposite to the first polarity, and
    the drive circuit is further configured to drive current in a second direction in the secondary winding to transmit a second signal, the second direction opposite the first direction.

4. The controller of claim 3, wherein:
    the driver interface comprises a first receiver coupled to the first primary terminal and a second receiver coupled to the second primary terminal, each receiver configured to compare the portion of signal on its respective primary terminal with its respective threshold; and the drive circuit comprises one of a first transmitter configured to drive the current in the first direction and a second transmitter configured to drive current in the second direction.

5. The controller of claim 4, wherein:
the driver interface further comprises a command transmitter configured to transmit on-command signals having an on-command signal polarity to turn on the power switch, and off-command signals having an off-command signal polarity to turn off the power switch, the on-command signal polarity being opposite to the off-command signal polarity, and
the drive circuit further comprising a drive signal generator coupled to receive the on-command signals and the off-command signals transmitted over the inductive coupling, the drive signal generator configured to generate a drive signal to turn on and turn off the power switch responsive to the on-command signals and the off-command signals.

6. The controller of claim 5, wherein the command transmitter and one of the first transmitter and the second transmitter can transmit their respective signals asynchronously.

7. The controller of claim 3, wherein the first reference potential of the driver interface is greater than the second reference potential of the driver circuit such that the first signal has a higher priority than the second signal and is received in the event of a collision with the second signal.

8. The controller of claim 7, wherein the first transmitter and the second transmitter can transmit their respective signals asynchronously.

9. The controller of claim 3, wherein the current in the first direction that transmits the first signal is a fault signal representative of fault detection by the drive circuit and the current in the second direction that transmits the second signal is a data signal representative of an operational parameter detected by the drive circuit and the fault signal has a higher priority than the data signal.

10. The controller of claim 3, wherein:
the current in the second direction comprises a binary signal, and
the second transmitter is configured to provide current to flow through the secondary winding in the second direction to transmit bits of the binary signal and to provide current to flow through the secondary winding in the first direction to demagnetize the inductive coupling before or after a bit is transmitted.

11. The controller of claim 10, the second transmitter comprising:
a first switch coupled to the first secondary terminal and configured to provide current flow in the first direction to demagnetize the inductive coupling; and
a second switch coupled to the second secondary terminal and configured to provide current flow in the second direction to transmit bits, the first direction being current flow from the first secondary terminal to the second secondary terminal and the second direction being current flow from the second secondary terminal to the first secondary terminal.

12. The controller of claim 11, the second transmitter further comprising an encoder coupled to the first switch and the second switch, the encoder configured to control the first switch to provide current flow in the first direction to demagnetize the inductive coupling and configured to control the second switch to provide current flow in the second direction to transmit bits.

13. The controller of claim 2, the first transmitter further comprising:
a first switch coupled to the first secondary terminal; and
a second switch coupled to the second secondary terminal, the first and second switches configured to be controlled by a detection of a fault.

14. The controller of claim 2, the first receiver comprising:
a first comparator coupled to compare at least the portion of the signal on the first primary terminal with the first current threshold and configured to output a first current comparison result;
a first integrator configured to integrate the first current comparison result to generate a first integration result; and
a second comparator coupled to compare the first integration result with a first time threshold.

15. The controller of claim 14, the second receiver comprising:
a third comparator coupled to compare at least the portion of the signal on the second primary terminal with the second threshold to output a second current comparison result;
a second integrator configured to integrate the second current comparison result to generate a second integration result; and
a fourth comparator coupled to compare the second integration result with a second time threshold.

16. The controller of claim 15, wherein a magnitude of the first threshold is greater than a magnitude of the second threshold and the first time threshold is representative of a second time period and the second time threshold is representative of a fourth time period, the fourth time period greater than the second time period.

17. The controller of claim 16, the data transmitter comprising a switchable current source which drives a data current into the second secondary terminal for a third period.

18. The controller of claim 17, the fault receiver comprising:
a third comparator coupled to the second primary terminal and configured to compare the signal at the second primary terminal with the second threshold, wherein the second threshold is related to a magnitude of the data current which indicates the data signal;
an integrator coupled to the third comparator and configured to integrate an output of the third comparator to generate a second integration result; and
a fourth comparator coupled to the integrator and configured to compare the second integration result with a second threshold, wherein the second threshold is related to the third period.

19. The controller of claim 2, the driver interface comprising:
a command transmitter configured to transmit an on-command to turn on the power switch and an off-command to turn off the power switch;
a fault receiver coupled to the first primary terminal and configured to compare a signal at the first primary terminal with a first threshold to determine when a fault signal has been received; and
a data receiver coupled to the second primary terminal and configured to compare a signal at the second primary terminal with a second threshold to determine when a data signal has been received; and
a drive circuit coupled to the secondary winding, the drive circuit comprising:

a fault transmitter coupled to the first secondary terminal and configured to drive a fault current into the first secondary terminal to provide the fault signal; and a data transmitter coupled to the second secondary terminal and configured to drive a data current into the second secondary terminal to provide the data signal.

20. The controller of claim 19, the fault transmitter comprising a switchable current source which drives the fault current into the first secondary terminal for a second period.

21. The controller of claim 19, the fault receiver comprising:

a first comparator coupled to the first primary terminal and configured to compare the signal at the first primary terminal with the first threshold, wherein the first threshold is related to a magnitude of the fault current which indicates the fault signal;

an integrator coupled to the first comparator and configured to integrate an output of the first comparator to generate a first integration result; and a second comparator coupled to the integrator and configured to compare the first integration result with a second threshold, wherein the second threshold is related to the second period.

* * * * *